United States Patent
Fuller

[11] Patent Number: 5,956,583
[45] Date of Patent: Sep. 21, 1999

[54] METHOD FOR FORMING COMPLEMENTARY WELLS AND SELF-ALIGNED TRENCH WITH A SINGLE MASK

[76] Inventor: Robert T. Fuller, 6000 Technology Blvd., Sandston, Va. 23150

[21] Appl. No.: 08/885,707

[22] Filed: Jun. 30, 1997

[51] Int. Cl.$^6$ .................................................. H01L 29/76
[52] U.S. Cl. .......................... 438/218; 438/223; 438/229; 257/372; 257/374
[58] Field of Search .................................. 438/223, 224, 438/225, 227, 229, 221, 218, 700; 257/299, 347, 350, 351, 372, 374

[56] References Cited

U.S. PATENT DOCUMENTS

| | | | |
|---|---|---|---|
| 4,244,752 | 1/1981 | Henderson et al. | 148/1.5 |
| 4,411,058 | 10/1983 | Chen | 29/571 |
| 4,470,191 | 9/1984 | Cottrell et al. | 29/576 |
| 4,509,991 | 4/1985 | Taur | 148/1.5 |
| 4,584,027 | 4/1986 | Metz, Jr. et al. | 148/1.5 |
| 4,654,119 | 3/1987 | Cook et al. | 438/700 |
| 4,656,730 | 4/1987 | Lynch et al. | 29/571 |
| 4,806,501 | 2/1989 | Baldi et al. | 438/224 |
| 5,023,193 | 6/1991 | Manoliu et al. | 437/31 |
| 5,087,582 | 2/1992 | Campbell et al. | 437/41 |
| 5,132,241 | 7/1992 | Su | 437/70 |
| 5,252,501 | 10/1993 | Moslehi | 437/34 |
| 5,272,367 | 12/1993 | Dennison et al. | 257/306 |
| 5,567,550 | 10/1996 | Smayling | 430/5 |
| 5,573,962 | 11/1996 | Sung | 437/34 |
| 5,759,881 | 6/1998 | Manning | 438/199 |

Primary Examiner—Donald L. Monin, Jr.
Assistant Examiner—Michael Dietrich
Attorney, Agent, or Firm—Jaeckle Fleischmann & Mugel, LLP

[57] ABSTRACT

An integrated circuit includes a plurality of CMOS transistors formed in a monocrystalline substrate. Within the substrate is a plurality of complementary spaced pairs of a p-well region and a n-well region. Between each well region, each of which has a source, gate, and drain, is a self-aligned trench filled with semiconductor material. A method of fabricating a field effect transistor entails a first step of forming a layer of first insulative material over a monocrystalline substrate. Next, a layer of semiconductor material is formed over the first insulative material. A p- or n-well masking layer is formed over the semiconductor layer and patterned to expose a first portion of the underlying semiconductor layer. A first dopant of one polarity is implanted in the region of the substrate aligned with the semiconductor layer first portion, which is then converted into a second insulative material. The masking layer is removed, thereby exposing the remaining portion of the semiconductor layer. A second dopant of opposite polarity to the first dopant is then implanted into the remaining portion. Removal of the first portion and the exposed remaining portion of the semiconductor material exposes a step of semiconductor material, which, along with a portion of the substrate aligned with the step, is subsequently removed to form a trench. The trench is filled with a second semiconductor material.

20 Claims, 3 Drawing Sheets

METHOD FOR FORMING COMPLEMENTARY WELLS AND SELF-ALIGNED TRENCH WITH A SINGLE MASK

FIELD OF THE INVENTION

The present invention relates to a field effect transistor ("FET") device and, more particularly, to an improved FET device and a process for forming same.

BACKGROUND OF THE INVENTION

Advanced CMOS technology employs complementary n- and p-wells in order to simultaneously optimize the NMOS and PMOS transistors. The conventional complementary well formation process employs one or two microlithography masking steps. The two mask fabrication process has the advantage that it does not degrade the silicon surface planarity or topography. This is an important requirement in advanced CMOS technology where even a small (e.g. a few thousand angstroms) step between the n-well and p-well regions can result in gate wavelength variations between the NMOS and PMOS transistors. The CMOS transistor gate length variations can degrade manufacturability and yield. As a result, the process simplicity of the conventional one mask fabrication process is not a strong and sufficient advantage/improvement to justify its use in the semiconductor technology since the one mask process creates a step or undesired surface topography during the process.

The surface topography problem in the conventional one mask fabrication process is generated by a selective thermal oxidation process. An example of a one mask fabrication process is disclosed in U.S. Pat. No. 5,252,501 (the "'501 patent"). In the '501 patent, the process begins with an oxide/nitride stack patterned and used (usually along with the photoresist mask) as an ion implantation mask to define one of the wells. After removal of the photoresist, an oxidation step is performed which selectively defines an oxide hard mask over the implanted area. A second ion implantation step is used to define the second (opposite) well regions. As recognized in the '501 patent, this process generates an undesired surface topography or step between the n- and p-well regions due to the silicon consumption by the selective thermal oxidation step.

The '501 patent attempts to solve this step problem by using selective semiconductor growth processes. This solution to the step problem, however, does not solve the problem if conventional materials and conventional processes are used.

SUMMARY OF THE INVENTION

The present invention is directed to an integrated circuit that comprises a plurality of CMOS transistors. The CMOS transistors are formed in a monocrystalline substrate. Within the substrate is a plurality of complementary spaced pairs of a p-well region and a n-well region. Between each well region is a self-aligned trench filled with semiconductor material. Each well region also has a source, gate and drain.

Further in accordance with the present invention, a method of fabricating this transistor is disclosed. The process entails a first step of forming a layer of first insulative material over a monocrystalline substrate. Next, a layer of semiconductor material is formed over the first insulative material. The following step includes forming and patterning one of a p- or n-well masking layer over the semiconductor layer to expose a first portion of the underlying semiconductor layer. Once this patterning step is completed, a first dopant of one polarity is implanted in the region of the substrate aligned with the first portion of the semiconductor layer. This first portion is then converted into a second insulative material and the masking layer is removed, thereby exposing the remaining portion of the semiconductor layer. A second dopant of opposite polarity to the first dopant is then implanted into the remaining portion.

The method also includes removing the first portion and exposed remaining portion of the semiconductor material. This removal process exposes a step of semiconductor material. The step is subsequently removed along with a portion of the substrate aligned with the step to form a trench. The trench is filled with a second semiconductor material.

DETAILED DESCRIPTION OF THE INVENTION

The previously described steps that degrade a CMOS transistor are diminished in the present invention. In this invention, a one mask fabrication process utilizes the step created by the thermal oxidation procedure. The step is removed along with a portion of the underlying substrate to form a self-aligned trench located between two complementary wells where upper surfaces lie in a substantially common plane.

Figure 1A:
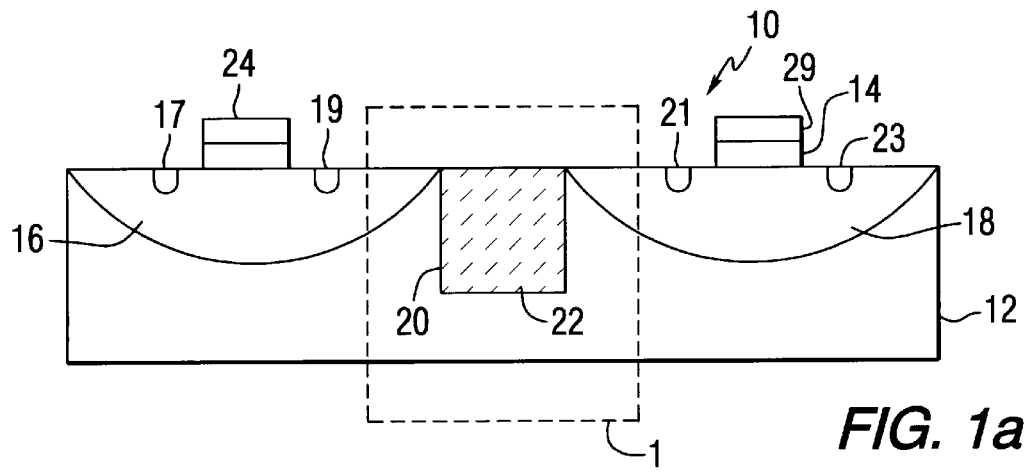
FIG. 1a is a schematic representation of a CMOS transistor of the present invention.

The present invention, as illustrated in FIG. 1a, is directed to an integrated circuit that comprises a plurality of CMOS transistors 10. The CMOS transistors 10 are formed in a monocrystalline substrate 12. Within substrate 12 is a plurality of complementary spaced pairs of a p-well region 16 and a n-well region 18. Between these well regions 16, 18 is a self-aligned trench 20 filled with a second semiconductor material 22. Within each well region 16, 18 is one set of heavily doped regions 17, 19, 21, 23. Each heavily doped region 17, 19, 21, 23 is doped of an opposite polarity to the well region 16, 18 it lies within.

Within each well region one of the heavily doped regions is designated a source and the other a drain. Between each source and drain of each transistor is a gate 24. Gate 24 comprises an insulation layer 14 over the substrate 12 and a semiconductor material 29 over insulation 14. The process for the present invention, however, is directed to the structure set forth in FIG. 1b.

Figure 1B:
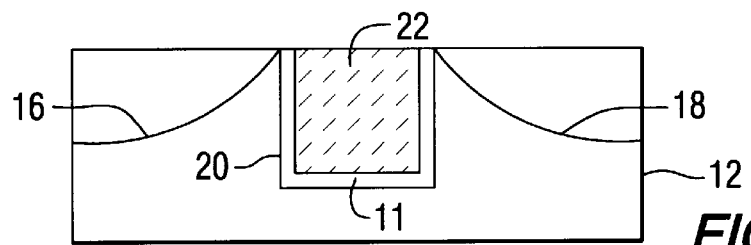
FIG. 1b is an enlarged view of FIG. 1a in box 1.
Figure 2A:
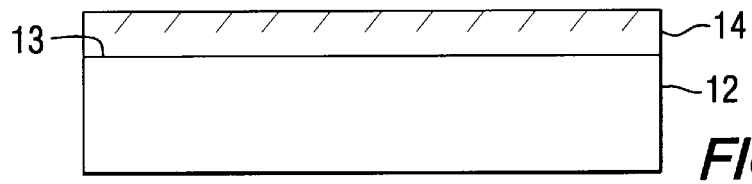
FIGS. 2a–i are a schematic depicting a process of the present invention.

The present invention illustrated in FIG. 1b is attained through a one mask technique illustrated in FIGS. 2a–i. Turning to FIG. 2a, a layer of first insulative material 14 is applied over a monocrystalline substrate 12. In particular, substrate 12 is a starting wafer composed for example of monocrystalline silicon. Insulation layer 14, preferably an oxide layer, is formed over or on the upper surface 13 of wafer 12. Oxide layer 14 is formed by low-temperature chemical vapor deposition techniques or rapid thermal oxidation processes that form an insulative material ranging from 250 to 350 angstroms in thickness. These processes ensure first insulation layer 14 is adequately attached over, preferably on, substrate 12 for further deposition of elements.

Figure 2B:
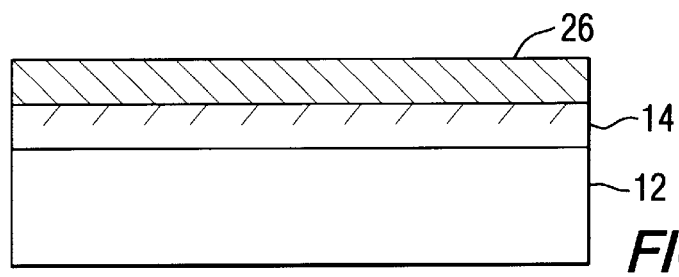

After the initial step of applying insulative material 14 over substrate 12, a layer of first semiconductor material 26, as illustrated in FIG. 2b, is applied over, preferably on, insulative material 14. Semiconductor material 26 ranges from 4,500 to 5,500 angstroms thick and can be applied by a low-pressure chemical vapor deposition (LPCVD) process. In this embodiment of the present invention semiconductor material 26 is polysilicon material.

Figure 2C:
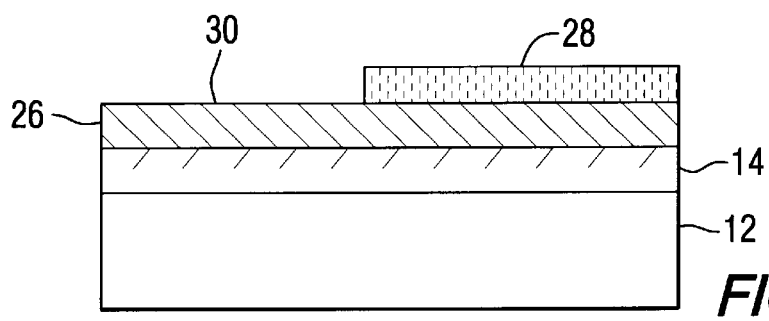

The next step, shown in FIG. 2c, entails forming and patterning one of a p- or n-well masking layer 28 over, preferably on, the semiconductor layer 26 to expose a first portion 30 of the underlying semiconductor layer 26. Masking layer 28 is conventionally 700 to 900 angstroms thick. In one embodiment of the present invention masking layer 28 is a nitride material.

Figure 2D:
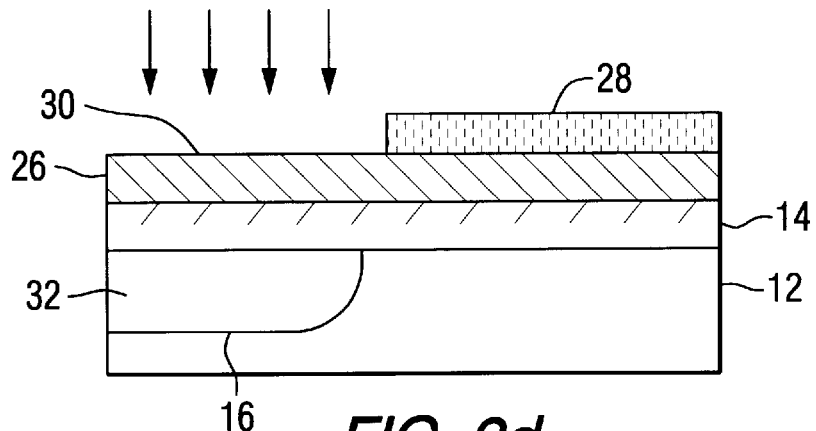

Turning to FIG. 2d, a first dopant of one polarity is implanted in region 32 of the substrate 12 aligned with the first portion 30. The first dopant is a high implant energy source used to penetrate semiconductor material 26. Conventionally, the implant is a dose of 2e12, energy of 360 KeV of boron and forms p-well 16. The masking layer 28 blocks the boron ions from penetrating into the underlying substrate 12.

Figure 2E:
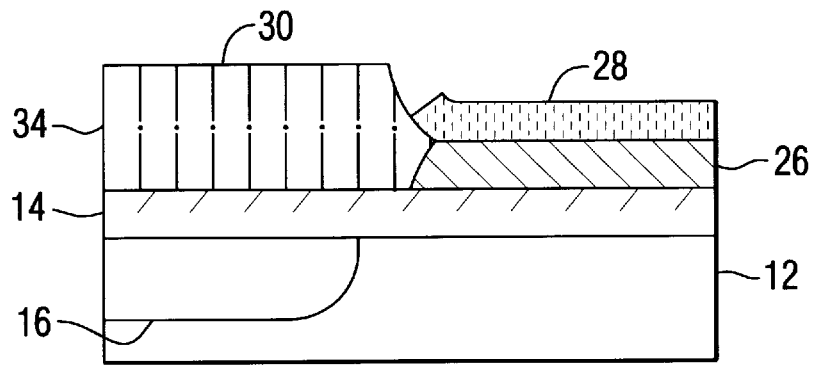

As shown in FIG. 2e, first portion 30 is converted into a second insulative material 34 using a poly-buffered localized oxidation isolation (conventionally known as "PBLOCOS") method. The second insulative material 34 is, in this embodiment, a derivative of silicon dioxide. Normally, the PBLOCOS process is a thermal oxidation step of heating the first portion 30 at about a 1000 degrees Celsius for about two hours. During this process step, substrate 12 is not affected.

Figure 2F:
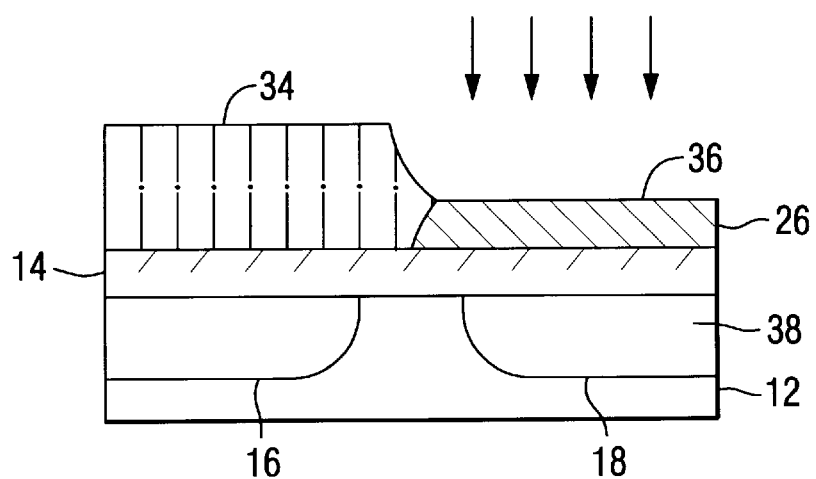

After the conversion of first portion 30, masking layer 28 is removed exposing a remaining portion 36 of semiconductor layer 26. As illustrated in FIG. 2f, a second dopant of opposite polarity to the first dopant is then implanted in region 38 of substrate 12 aligned with exposed remaining portion 36. The second dopant normally forms n-well 18 with phosphorus ions. Oxide layer 34 blocks the phosphorus ions from entering the p-well 32.

Figure 2G:
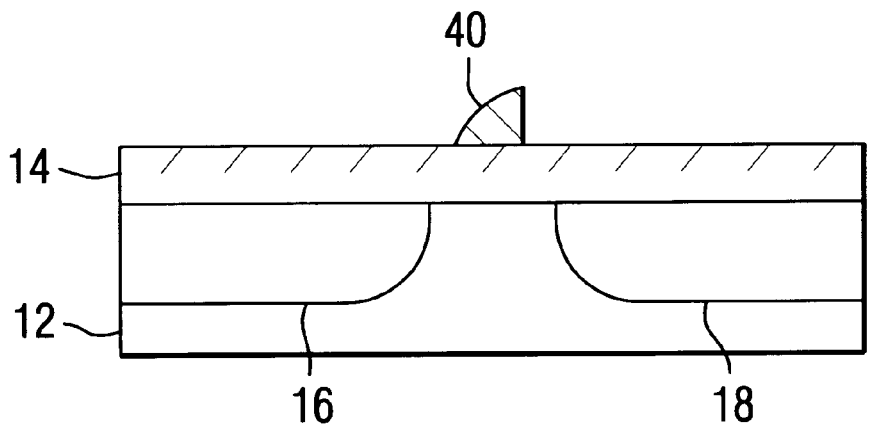

Turning to FIG. 2g, first portion 30 (oxide layer 34) and exposed remaining portion 36 of semiconductor material 26 are removed. This removal process exposes a step 40 of semiconductor material 26. The standard process to remove the first portion 30 and exposed remaining portion 36 is an anisotropic etch in a reactive ion etching system.

Figure 2H:
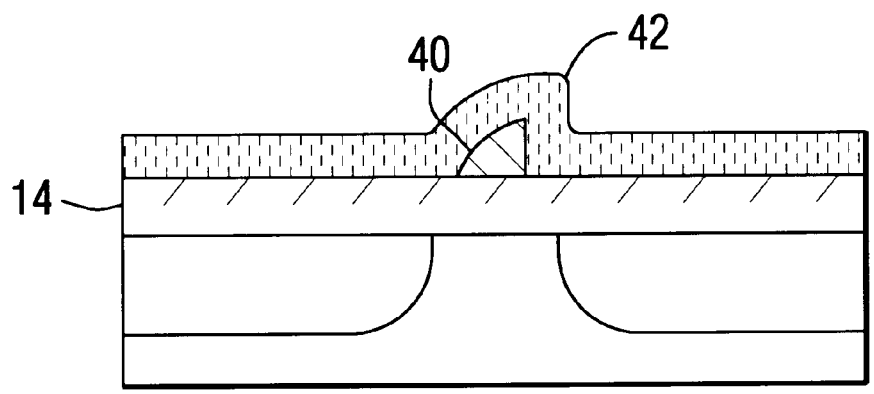

Turning to FIG. 2h, step 40 along with the exposed insulative material 14 are coated with a second protective layer 42, preferably a nitride layer. The portion of second protective layer 42 overlaying step 40 is removed. This removal process is normally completed by etch back or chemical-mechanical polish process. Thereby, step 40 is exposed and surrounded by second protective layer 42.

Step 40 is subsequently removed along with portions of substrate 12 aligned with step 40 to form trench 20. The trench forming process to remove the step and portion of substrate 12 is a conventional etching processes. Preferably, trench 20 is about equal to the depth of the deepest well, n-well or p-well.

Figure 2I:
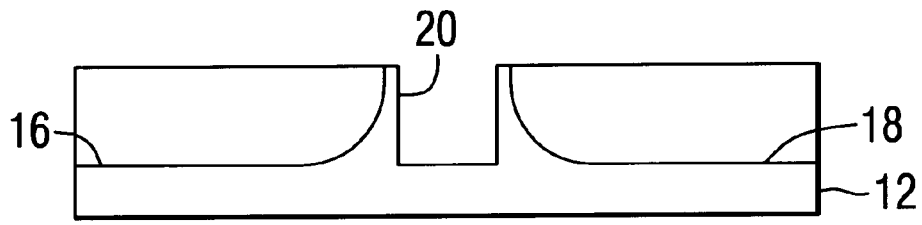

After trench 20 is formed, remaining second protective layer 42 and predetermined portions of oxide layer 14 are removed as shown in FIG. 2i. This removal process, preferably, occurs by known stripping procedures of the semiconductor industry.

Turning to FIG. 1b, trench 40 is thermally oxidized in the same manner substrate 12 was oxidized to form oxidized layer 11, and filled with second semiconductor material 22, preferably polysilicon, by a LPCVD process.

In order to fully activate the dopants in the respective n-well and p-well without pushing the junction too deep, a high-temperature rapid thermal anneal (RTA) is used.

The invention has been described in detail for the purpose of illustration, but it is understood that such detail is solely for that purpose, and variations can be made therein by those skilled in the art without departing from the spirit and scope of the invention, which is defined by the following claims.

I claim:

1. A method of fabricating a field effect transistor comprising the following steps:

forming a layer of first insulative material over a monocrystalline substrate;

forming a layer of semiconductor material over said insulative material;

forming and patterning one of a p- or n-well masking layer over said semiconductor layer to expose a first portion of the underlying semiconductor layer;

implanting a first dopant of one conduction type in regions of the substrate aligned with the first portion of the semiconductor layer, thereby forming a first well of one conduction type in said substrate;

converting the first portion of the semiconductor layer into a second insulative material;

removing the masking layer to expose the remaining portion of the semiconductor layer, implanting a second dopant of opposite conduction type to said first dopant in regions of the substrate aligned with the exposed remaining portions of the semiconductor material, thereby forming a second well of opposite conduction type in said substrate;

removing the converted first and exposed remaining portions of the semiconductor material to form a step of semiconductor material, and forming a trench aligned with the step of semiconductor material and between the first and second wells.

2. The method according to claim 1 comprising the further step of forming and patterning a second masking layer around the step of semiconductor material.

3. The method according to claim 1 wherein the implanting of the first dopant forms a P-well.

4. The method according to claim 1 wherein the implanting of the second dopant forms a N-well.

5. The method according to claim 1 wherein the converting of the first portion occurs at about 1000 degrees celsius for about two hours.

6. The method according to claim 1 wherein the converting of the first portion occurs with thermal oxidation.

7. The method according to claim 1 wherein the depth of the trench is about equal to the depth of the deepest well.

8. The method according to claim 1 further comprising the step of oxidizing the sidewalls of the trench and filling the trench with a second semiconductor material.

9. The method according to claim 8 wherein the first and second semiconductor material is polysilicon material.

10. The method according to claim 1 wherein said forming a layer of a first insulative material is on a monocrystalline substrate; said forming a layer of semiconductor material is on said insulative material; and said forming and patterning one of the p- or n-well masking layer is on said semiconductor layer.

11. The method according to claim 1 wherein the converting of the first portion occurs only to the semiconductor material.

12. The method according to claim 1 wherein the implanted regions are not oxidized.

13. A method of fabricating a field effect transistor comprising the following steps:

oxidizing a silicon monocrystalline substrate to form a layer of silicon dioxide;

depositing a layer of polysilicon over said silicon dioxide;

forming and patterning a layer of nitride over said polysilicon layer to define p-well regions;

implanting a p-type dopant to form p-wells in the substrate;

oxidizing the p-well regions of said polysilicon layer;

remove the nitride layer to expose n-well regions;

implanting an n-type dopant to form n-wells in the substrate;

removing the p-well and n-well regions of said polysilicon layer to form a step of polysilicon; and forming a trench aligned with the step of polysilicon and between the p- and n-wells.

14. The method according to claim 13 comprising the further step of forming and patterning a second masking layer around the step of polysilicon.

15. The method according to claim 13 wherein the oxidizing of the p-well regions occurs at about 1000 degrees celsius for about two hours.

16. The method according to claim 13 wherein the oxidizing of the p-well regions occurs with thermal oxidation.

17. The method according to claim 13 wherein the depth of the trench is about equal to the depth of the deepest well.

18. The method according to claim 13 further comprising the step of oxidizing the sidewalls of the trench and filling the trench with a second polysilicon material.

19. The method according to claim 15 wherein said depositing a layer of polysilicon is on said silicon dioxide; and said forming and patterning a layer of nitride is on said polysilicon.

20. The method according to claim 13 further comprising:

oxidizing the sidewalls of the trench and filling the trench with polysilicon.

* * * * *